United States Patent
Huang et al.

(10) Patent No.: US 11,885,849 B2
(45) Date of Patent: Jan. 30, 2024

(54) METHOD FOR MONITORING A MACHINE ON THE BASIS OF ELECTRIC CURRENT SIGNALS AND DEVICE FOR IMPLEMENTING SUCH A METHOD

(71) Applicant: Cartesiam, Toulon (FR)

(72) Inventors: He Huang, Toulon (FR); Francois De Grimaudet De Rochebouet, Toulon (FR)

(73) Assignee: STMicroelectronics International N.V., Geneva (CH)

( * ) Notice: Subject to any disclaimer, the term of this patent is extended or adjusted under 35 U.S.C. 154(b) by 27 days.

(21) Appl. No.: 17/483,014

(22) Filed: Sep. 23, 2021

(65) Prior Publication Data
US 2022/0091188 A1 Mar. 24, 2022

(30) Foreign Application Priority Data
Sep. 23, 2020 (FR) ...................... 2009625

(51) Int. Cl.
*G01R 31/34* (2020.01)
*G06N 20/00* (2019.01)
*G01R 19/165* (2006.01)

(52) U.S. Cl.
CPC ......... *G01R 31/343* (2013.01); *G01R 19/165* (2013.01); *G06N 20/00* (2019.01)

(58) Field of Classification Search
CPC .... G01R 31/343; G01R 19/165; G06N 20/00; G06N 3/08; G06N 5/02; F04B 49/06; F04B 51/00; G06F 11/3013; G06F 11/3058; G06K 9/6215
See application file for complete search history.

(56) References Cited

U.S. PATENT DOCUMENTS

| | | | | |
|---|---|---|---|---|
| 8,484,217 | B1 * | 7/2013 | Srivastava | G06F 16/951 707/738 |
| 9,443,201 | B2 * | 9/2016 | Claussen | G06K 9/6284 |
| 2006/0242097 | A1 * | 10/2006 | Gu | G06N 5/022 706/45 |
| 2016/0011268 | A1 * | 1/2016 | Tsai | G01R 31/343 702/58 |

(Continued)

FOREIGN PATENT DOCUMENTS

| | | | |
|---|---|---|---|
| FR | 3062733 A1 | 8/2018 | |
| JP | H06351296 A * | 12/1994 | H02P 27/06 |
| WO | 2020058075 A1 | 3/2020 | |

OTHER PUBLICATIONS

Kulkarni et al., "Review on Online Monitoring of Electrical Machine using IOT," 2019 International Conference on Nascent Technologies in Engineering (ICNTE), 2019, pp. 1-4 (Year: 2019).*

(Continued)

*Primary Examiner* — Natalie Huls
(74) *Attorney, Agent, or Firm* — Slater Matsil, LLP

(57) ABSTRACT

A method can be used for supervising the operation of a machine powered with electric current. The method includes operating the machine in a normal operation mode, repeatedly performing a learning phase for learning the normal operation machine of the machine to create a knowledge base, autonomously switching from the learning phase into a supervision phase when the knowledge base is considered to have been created, and repeatedly performing the supervision phase.

20 Claims, 2 Drawing Sheets

(56) References Cited

U.S. PATENT DOCUMENTS

2021/0048482 A1* 2/2021 Ukumori ............... H01M 10/42
2022/0011154 A1 1/2022 De Grimaudet De Rochebouet
2022/0148799 A1* 5/2022 Tsai ........................ G01J 5/027

OTHER PUBLICATIONS

Lu et al., "ADGS: Anomaly Detection and Localization Based on Graph Similarity in Container-Based Clouds," 2019 IEEE 25th International Conference on Parallel and Distributed Systems (ICPADS), 2019, pp. 53-60 (Year: 2019).*
Kavana et al., "Fault Analysis and Predictive Maintenance of Induction Motor Using Machine Learning," 2018 International Conference on Electrical, Electronics, Communication, Computer, and Optimization Techniques (ICEECCOT), 2018, pp. 963-966 (Year: 2018).*
Senanayaka et al., "Early detection and classification of bearing faults using support vector machine algorithm," 2017 IEEE Workshop on Electrical Machines Design, Control and Diagnosis (WEMDCD), 2017, pp. 250-255 (Year: 2017).*

* cited by examiner

METHOD FOR MONITORING A MACHINE ON THE BASIS OF ELECTRIC CURRENT SIGNALS AND DEVICE FOR IMPLEMENTING SUCH A METHOD

CROSS-REFERENCE TO RELATED APPLICATIONS

This application claims the benefit of French Patent Application No. 2009625, filed on Sep. 23, 2020, which application is hereby incorporated herein by reference.

TECHNICAL FIELD

Embodiments relate to a method for monitoring a machine on the basis of electric current signals and device for implementing such a method.

BACKGROUND

To detect anomalies in the operation of a machine such as a motor, a pump, a compressor, or a fan, it is known to study the electric current at the output of the machine, which might change when parts of the machine are defective or clogged. In particular, the detection of anomalies from the electric current has the interest of being independent of the environment of the machine, which is not the case for example, of a detection of anomalies based on the profile of the vibrations generated by the machine, which poses a problem in particular when the machine is moving or proximate to another machine.

Thus, anomalies could be identified before they become too serious and cause additional damages or unanticipated interruptions. For this purpose, the machine is supervised by means of an electric current sensor positioned on the machine and an anomaly detection algorithm is applied on the current measured by the sensor.

Conventionally, such anomaly detection algorithms use deep-learning techniques such as neural networks, allowing obtaining high detection rates. Such techniques require the use of powerful processors and a considerable amount of memory resources to be functional.

Thus, these techniques are not compatible with an implementation on a microcontroller limited in terms of memory resources yet having a high integration capacity.

Hence, there is a need to design an algorithm for detecting anomalies from electric current signals, allowing obtaining detection rates that are comparable to those obtained with deep-learning techniques, implemented on a microcontroller that could be embedded on any system irrespective of its environment.

SUMMARY

Embodiments of the present invention relate to a method for supervising the operation of a machine from electric current signals and a device for the implementation of such a method. Embodiments can provide a solution to problems discussed above, e.g., by enabling the detection of anomalies from the electric current thanks to an algorithm implemented on a microcontroller having a high integration capacity.

A first aspect of the invention relates to a method for supervising the operation of a machine powered with electric current, including a phase of learning the normal operation of the machine and a supervision phase. The learning phase operates to acquire in the time domain a first electric current signal generated by the machine, determine a first electric current signature corresponding to the first electric current signal, determine a first similarity rate between the first electric current signature and each of the electric current signatures recorded in a knowledge base, compare the first similarity rate with a predetermined first threshold, and, if the first similarity rate is lower than the first threshold, record the electric current signature in the knowledge base.

The supervision phase operates to acquire in the time domain a second electric current signal generated by the machine, determine a second electric current signature corresponding to the second electric current signal, determine a second similarity rate between the second electric current signature and each of the electric current signatures recorded in the knowledge base, compare the second similarity rate with a predetermined second threshold, and, if the second similarity rate is lower than the second threshold, generate a warning, the second electric current signature being considered as revealing an anomaly. The steps of the learning phase are periodically repeated so as to constitute the knowledge base, the steps of the supervision phase being periodically repeated and the supervision method autonomously switching from the learning phase into the supervision phase when the knowledge base is considered as being constituted.

At first, the supervision method learns how to autonomously recognize the electric current signals that characterize a normal operation of the machine. Afterwards, secondly, the supervision method acquires and compares electric current signals on a regular basis in order to determine whether the machine deviates from its normal operation. Thanks to the invention, it is therefore possible to effectively detect whether an anomaly has occurred and in this case, trigger a warning.

In addition, during its learning phase, the monitoring method records only the electric current signatures that are different enough from the already learnt signatures, that is to say the signatures already recorded in the knowledge base, which allows avoiding redundancy of information and limiting the number of data stored during the learning without reducing the quality of the learning. The supervision method could then be implemented on devices limited in terms of resources, such as a microcontroller.

Besides the features that have just been mentioned in the previous paragraph, the method according to the first aspect of the invention may have one or several complementary feature(s) among the following ones, considered individually or according to any technically-feasible combination.

According to one variant, the learning phase further includes a specific step of comparing the first similarity rate of a predetermined number M of electric current signatures determined consecutively with a predetermined specific threshold higher than the first threshold, the knowledge base being considered as being constituted if the first similarity rate of the last M electric current signatures is higher than the specific threshold.

According to a variant that is compatible with the previous variant, the supervision phase includes a so-called "discovery" period during which the second electric current signature considered as revealing an anomaly is recorded in the knowledge base.

According to a variant that is compatible with the previous variants, the supervision phase includes a step of comparing the duration of the anomaly with a predetermined duration, the anomaly being acknowledged if the duration of the anomaly is longer than the predetermined duration.

According to a variant that is compatible with the previous variants, the supervision phase further includes a step of transmitting the warning.

According to a variant that is compatible with the previous variants, the supervision phase further includes a step of transmitting an analysis report performed periodically.

According to a variant that is compatible with the previous variants, steps of the learning phase are repeated periodically according to a first repetition period, steps of the supervision phase being repeated periodically according to a second repetition period longer than the first repetition period.

According to a variant that is compatible with the previous variants, the second threshold of the second comparison step is lower than the first threshold of the first comparison step.

A second aspect of the invention relates to a supervision device for the implementation of a method according to the first aspect of the invention, the supervision device being intended to be installed on a machine powered with electric current. The device includes an electric current sensor adapted and configured to acquire an electric current signal and a microcontroller adapted and configured to determine an electric current signature corresponding to the electric current signal, determine a similarity rate between the electric current signature and a knowledge base in which electric current signatures are recorded, and compare the similarity rate with a predetermined threshold. The device also includes a memory configured to record the electric current signature.

According to one variant, the electric current sensor is a current clamp or a motor controller.

A third aspect of the invention relates to a computer program product comprising instructions which, when the program is executed by a computer, lead the latter to implement the steps of the method according to the first aspect of the invention.

The invention and its different applications will be better understood upon reading the following description and upon examining the accompanying figures.

BRIEF DESCRIPTION OF THE DRAWINGS

The figures are presented for indicative purposes and do not limit the invention.

DETAILED DESCRIPTION OF ILLUSTRATIVE EMBODIMENTS

Unless stated otherwise, the same element appearing in different figures bears a unique reference.

Figure 1:
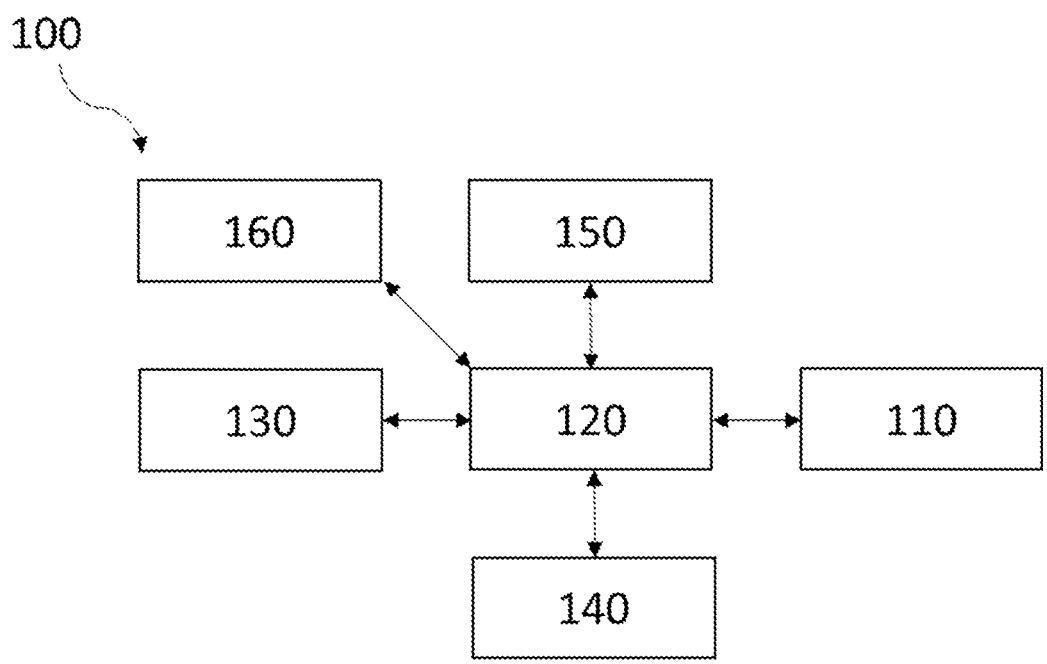
FIG. 1 is a block diagram of a device for supervising the operation of a machine according to an embodiment of the invention.

FIG. 1 represents an embodiment of a supervision device too according to the invention.

The supervision device 100 is intended to be installed on a machine powered with electric energy.

For example, the machine may consist of a motor, a pump, a compressor, a circuit breaker or a fan.

The supervision device too includes an electric current sensor 110, a microcontroller 120, a memory 130, a data transmission module 140, an electric power supply 150 and an activation member 160.

The electric current sensor 110 is adapted and configured to acquire an electric current signal generated by the machine.

For example, the electric current sensor 110 is a current clamp or a motor controller that uses a current measurement to regulate the speed and the direction of a motor in the case where the machine includes a motor.

The electric current signal obtained by the electric current sensor 110 is transmitted to the microcontroller 120 whose function is to analyze the received electric current signal. In particular, the microcontroller 120 is configured to determine an electric current signature from the electric current signal acquired by the electric current sensor 110, as described in more detail later on. For example, the microcontroller 120 includes a microprocessor.

The memory 130 is adapted and configured to record electric current signatures characterizing a normal operation of the machine. All of the electric current signatures stored in the memory form a knowledge base.

The data transmission module 140 is adapted and configured to transmit analysis reports on a periodic basis, as well as warnings when anomalies are detected. For example, these data are transmitted to a supervision console which allows visualizing the analysis reports and managing the warnings. Preferably, the transmission module uses an IOT-type, standing for "Internet of Things", wireless communication network. For example, the IOT network may use the LoRa technology or the Sigfox technology.

The electric power supply 150 supplies the electrical energy necessary to the operation of the supervision device too. Advantageously, the electric power supply 150 is sized so that the supervision device too operates without interruption for an extended time period, in the range of several years. In order to reduce the electrical energy consumption, the supervision device too is advantageously configured to go into standby mode between each acquisition. For example, the electric power supply 150 includes a battery or a cell.

The activation member 160 can be used to turn on or turn off the supervision device too. Advantageously, the supervision device too includes one single activation member 160, which facilitates the use of the supervision device too. Once the activation member 160 is triggered, the supervision device too operates completely autonomously. For example, the activation member 160 is a pushbutton or a switch.

The supervision device too also includes fastening means (not represented) configured to hold the supervision device too on the machine. For example, the fastening means may consist of magnetic elements or adhesive elements.

Figure 2:
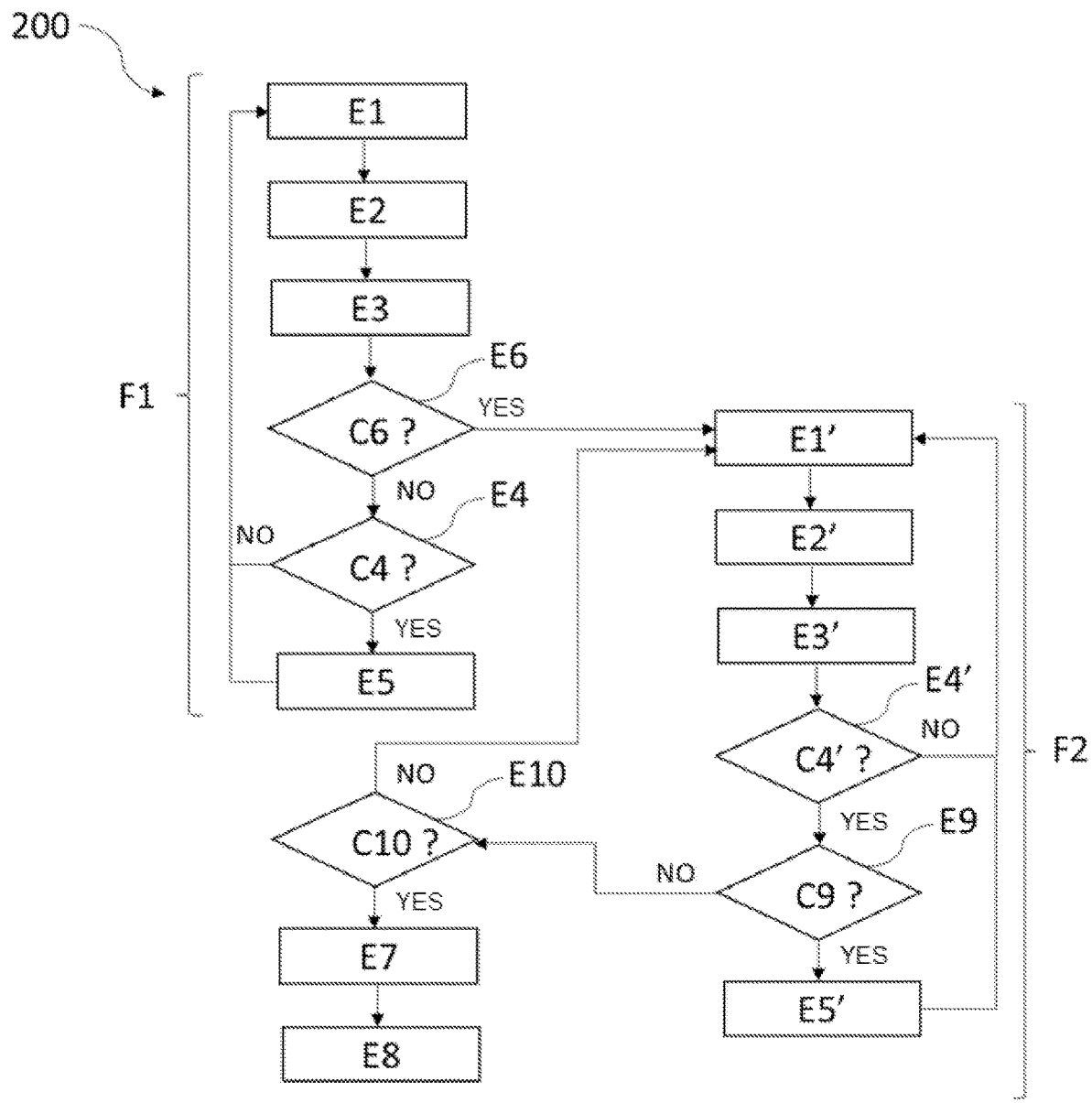
FIG. 2 is a flowchart of a method for monitoring the operation of a machine according to an implementation of the invention.

FIG. 2 shows a preferred implementation of a supervision method 200 according to the invention.

The supervision method 200 can be implemented by the supervision device too of FIG. 1.

The supervision method 200 includes a learning phase F1 aiming to constitute the knowledge base and a supervision phase F2 during which the electric current signals generated by the machine are compared with the knowledge base in order to detect differences that might reveal an anomaly in the machine. Thus, the supervision method 200 could be used to carry out predictive maintenance.

The learning phase F1 includes a first step E1 of acquiring in the time domain a first electric current signal generated by the machine. The electric current signal is an electric current sample measured at the output of the machine corresponding to a first acquisition duration, preferably comprised between 1 second and 5 seconds. For example, the first acquisition duration is equal to 2 seconds.

The first acquisition step E1 is performed at a sampling frequency comprised, for example, between 500 Hz and 5000 Hz.

The first acquisition step E1 is followed by a first step E2 of determining an electric current signature corresponding to the electric current signal acquired at the first acquisition step E1.

For example, the electric current signature is the previously-acquired electric current signal, or the previously-acquired electric current signal having undergone at least one treatment such as a signal smoothing to avoid the dispersion of the signal.

The electric current signature may also be determined from the electric current signal previously acquired in the time domain, transformed into an electric current signal in the frequency domain, for example by performing a Fourier transform. The electric current signal in the frequency domain extends over a frequency range that depends on the sampling frequency. This frequency range is divided into a predetermined number of intervals, for example equal to 128 or to 256. One coefficient is assigned to each frequency interval, each coefficient representing the magnitude of the electric current signal in the corresponding frequency interval. Hence, the electric current signature includes a series of values that characterize the electric current signal collected on the machine. This type of electric current signature is particularly advantageous in the case where the machine has a cyclic operation.

Afterwards, the method proceeds with a first step E3 of determining a first similarity rate SR1 between the electric current signature determined at the first determination step E2 and the electric current signatures present in the knowledge base.

Methods for calculating the similarity rate are known to those skilled in the art and therefore will not be described in more detail. In particular, such methods are used in the fingerprint recognition field. As a non-limiting example, the similarity rate can be determined through a remote calculation in an N-dimension space where N is herein equal to the number of coefficients included in the electric current signature. The similarity rate may be expressed in percentages.

Afterwards, during a first comparison step E4, the first similarity rate SR1 is compared with a predetermined first threshold TH1. If a first comparison condition C4 is met, that is to say if the first similarity rate SR1 is lower than the first threshold TH1, the first electric current signature is considered as being unknown. In this case, the first electric current signature is recorded in the knowledge base during a first recording step E5. Conversely, if the first comparison condition C4 is not met, that is to say if the first similarity rate SR1 is higher than the first threshold TH1, the first electric current signature is considered as being known. In this case, the first electric current signature is not recorded in the knowledge base.

For example, the first threshold TH1 is set at 90%.

The steps of the learning phase F1 are periodically repeated according to a first repetition period. Thus, the knowledge base, which is initially empty, is constituted progressively. For example, the first repetition period is equal to one minute. In other words, a new electric current signal is sampled every minute.

Preferably, the first repetition period is regular.

Advantageously, the learning phase F1 also includes a specific step E6 of comparing the first similarity rate of a predetermined number M of electric current signatures determined consecutively with a predetermined specific threshold TH0 higher than the first threshold TH1.

For example, the specific comparison step E6 is performed before the first step E4 of comparing the similarity rate with the first threshold TH1.

If a specific comparison condition C6 is met, that is to say if the first similarity rate SR1 of the last M electric current signatures is higher than the second threshold TH0, the knowledge base is considered as being constituted. In this case, the learning phase F1 ends and the supervision method 200 switches into the supervision phase F2.

If the specific comparison condition C6 is not met, that is to say if the similarity rate of at least one amongst the last M electric current signature is lower than the second threshold TH0, the learning phase F1 continues.

As a non-limiting example, the learning phase F1 could finish when the similarity rate of the last ten electric current signatures, which therefore correspond to the last ten acquired electric current signals, is higher than 98%.

The duration of the learning phase F1 depends on the machine on which the supervision device too is installed but in any case, the leaning phase F1 finishes autonomously.

According to another implementation, the knowledge base could be considered as being constituted at the end of a predetermined learning duration. In this case, the learning duration may be set according to the type of machine on which the supervision device too is intended to be installed.

The learning phase F1 is followed by the supervision phase F2 which comprises a second step E1' of acquiring a second electric current signal, a second step E2' of determining a second electric current signature corresponding to the second electric current signal and a second step E3' of determining a second similarity rate of the second electric current signature.

These second steps E1, E2', E3' performed during the supervision phase F2 are similar to the first steps E1, E2, E3 bearing the name performed during the learning phase F1.

Preferably, the duration of the second acquisition step E1' is identical to the duration of the first acquisition step E1. Alternatively, the duration of the acquisition steps E1, E1' may be different.

During the supervision phase F2, the second similarity rate SR2 is compared, during a second comparison step E4', with a predetermined second threshold TH2 lower than the first threshold TH1. If a second comparison condition C4' is met, that is to say if the second similarity rate SR2 is higher than the second threshold TH2, it is considered that the second electric current signature is known. If the second comparison condition C4' is not met, that is to say if the second similarity rate SR' is lower than the second threshold TH2, it is considered that the second electric current signature is not known and reveals an anomaly at the machine.

For example, the second threshold TH2 is set at 80%.

The supervision phase F2 includes a step E7 of generating a warning when an anomaly is recognized. Afterwards, the warning may be transmitted during a transmission step E8. Thus, an operator could be warned that an anomaly at the machine has been detected.

Besides sending a warning, the supervision phase F2 may also include a step (not represented) of transmitting a report of analysis of the electric current at the output of the machine. For example, the analysis report includes information relating to the amplitude of the electric current and in particular of the possible anomalies. The analysis report may also indicate the operation and shutdown times of the machine. The transmission of the analysis report is performed on a regular basis, for example every two hours.

According to this preferred embodiment, the supervision phase F2 includes a so-called "discovery" period which starts at the same time as the supervision phase F2. Advantageously, the supervision phase F2 includes a check-up phase E9 performed before generating the warning and during which it is checked up whether a check-up condition C9 is met, that is to say if the second electric current signal, corresponding to the second electric current signature revealing an anomaly, has been acquired during the discovery period.

If the check-up condition C9 is not met, that is to say if the second electric current signal has not been acquired during the discovery period, the step E7 of generating a warning could be carried out.

If the check-up condition C9 is met, the second electric current signature is recorded in the knowledge base during a recording step E5' and the step E7 of generating a warning is not carried out. In other words, it is considered that this is not really an anomaly but an electric current characteristic of the normal operation of the machine that has not occurred during the learning phase F1.

Thus, during the discovery period, the knowledge base is enriched. The discovery period is particularly useful for machines having operating cycles that vary over time.

Preferably, the discovery period has a predetermined duration, for example, equal to seven days.

Advantageously, the supervision phase F2 includes a step E10 of comparing the duration of the anomaly $T_A$ with a predetermined duration $T_0$.

If a duration comparison condition C10 is not met, that is to say if the duration of the anomaly $T_A$ is longer than the predetermined duration $T_0$, the step E7 of generating a warning is carried out. In this case, it is considered that the anomaly is actually acknowledged.

If the duration comparison condition C10 is not met, that is to say if the duration of the anomaly $T_A$ is shorter than the predetermined duration $T_0$, the step E7 of generating a warning is not carried out.

This comparison step E10 allows avoiding triggering warnings advertently, for example when the machine undergoes a one-off event, such as a power outage, which would cause a modification of the electric current.

The steps of the supervision phase F2 are periodically repeated according to a second repetition period.

Advantageously, the second repetition period is longer than the first repetition period in order to minimize the electrical energy consumption and therefore extend the duration of operation of the supervision device too.

For example, the second repetition period is equal to two minutes.

The second repetition period may be dynamic, that is to say it could vary, and in particular decrease, when an anomaly is detected. An advantage is to enable a more accurate characterization of the anomaly, in particular with regards to the duration thereof.

Naturally, the invention is not limited to the embodiments described with reference to the figures and variants could be considered without departing from the scope of the invention.

What is claimed is:

1. A method for supervising an operation of a machine powered with electric current, the method comprising:
    collecting, during a learning phase, a first electric current signal generated by the machine during a normal operation of the machine, the first electric current signal being collected in the time domain, the learning phase repeated periodically;
    applying a transformation to the first electric current signal to a first electric current signature;
    creating a knowledge base by recording the first electric current signature therein, the recording being in response to a first similarity rate between the first electric current signature and each electric current signature in the knowledge base being less than a predetermined first threshold;
    collecting, during a supervision phase, a second electric current signal generated by the machine in the time domain, the machine autonomously switching from the learning phase to the supervision phase in response to a creation of the knowledge base;
    applying a transformation to the second electric current signal to a second electric current signature; and
    generating a warning in response to a second similarity rate between the second electric current signature and each of the electric current signatures in the knowledge base being less than a predetermined second threshold, and the warning indicating an anomaly related to the second electric current signature.

2. The method according to claim 1, wherein the learning phase further comprises comparing the first similarity rate of a predetermined number M of electric current signatures determined consecutively with a predetermined specific threshold higher than the predetermined first threshold, the knowledge base considered as being created in response to the first similarity rate of the last M electric current signatures being greater than the predetermined specific threshold.

3. The method according to claim 1, wherein the supervision phase includes a discovery period during which a third electric current signature that is considered as revealing the anomaly is recorded in the knowledge base without generating the warning.

4. The method according to claim 1, wherein the supervision phase comparing a duration of the anomaly with a predetermined duration, the anomaly being acknowledged in response to the duration of the anomaly being greater than the predetermined duration.

5. The method according to claim 1, wherein the supervision phase further comprises transmitting the warning.

6. The method according to claim 1, wherein the supervision phase further periodically transmitting an analysis report.

7. The method according to claim 1, wherein the learning phase is repeated periodically according to a first repetition period and wherein the supervision phase is repeated periodically according to a second repetition period that is longer than the first repetition period.

8. The method according to claim 1, wherein the predetermined second threshold is lower than the predetermined first threshold.

9. A device comprising a microcontroller and a memory storing a program, wherein the program comprises software to be executed by the microcontroller to perform the method according to claim 1.

10. The method according to claim 9, wherein the device comprises a second memory storing the knowledge base.

11. The method according to claim 9, wherein the device comprises an electric current sensor for measuring the first electric current signal and providing information related to the collected first electric current signal to the microcontroller.

12. A device intended for a machine powered with electric current, the device comprising:

an electric current sensor configured to acquire an electric current signal;

a microcontroller configured to:

collect, during a learning phase, a first electric current signal generated by the machine during a normal operation of the machine, the first electric current signal being collected in the time domain;

apply a transformation to the first electric current signal to a first electric current signature;

create a knowledge base by recording the first electric current signature therein, the recording being in response to a first similarity rate between the first electric current signature and each electric current signature in the knowledge base being less than a predetermined first threshold;

collect, during a supervision phase, a second electric current signal generated by the machine in the time domain;

apply a transformation to the second electric current signal to a second electric current signature;

generate a warning in response to a second similarity rate between the second electric current signature and each of the electric current signatures in the knowledge base being less than a predetermined second threshold, and the warning indicating an anomaly related to the second electric current signature; and a memory configured to record the electric current signature.

13. The device according to claim 12, wherein the microcontroller is configured to:

periodically perform the learning phase to create the knowledge base, autonomously switch from the learning phase into the supervision phase in response to the knowledge base being considered to have been created; and periodically perform the supervision phase.

14. The device according to claim 12, wherein the machine is a motor, a pump, a compressor, or a fan.

15. The device according to claim 12, wherein the machine is a motor, and wherein the electric current sensor is a current clamp or a motor controller that uses a current measurement to regulate a speed and a direction of the motor.

16. A machine comprising:

a component operated using an electric current;

an electric current sensor configured to acquire an electric current signal of the component;

a memory storing a program; and a microcontroller coupled to the memory to execute the program to:

collect, during a learning phase, a first electric current signal generated by the machine during a normal operation of the machine, the first electric current signal being collected in the time domain, the learning phase repeated periodically;

apply a transformation to the first electric current signal to a first electric current signature;

create a knowledge base by recording the first electric current signature therein, the recording being in response to a first similarity rate between the first electric current signature and each electric current signature in the knowledge base being less than a predetermined first threshold;

collect, during a supervision phase, a second electric current signal generated by the machine in the time domain, the machine autonomously switching from the learning phase to the supervision phase in response to a creation of the knowledge base;

apply a transformation to the second electric current signal to a second electric current signature; and generate a warning in response to a second similarity rate between the second electric current signature and each of the electric current signatures in the knowledge base being less than a predetermined second threshold, the warning indicating an anomaly related to the second electric current signature.

17. The machine of claim 16, further comprising a second memory coupled to the microcontroller and storing the knowledge base.

18. The machine according to claim 16, wherein the machine is a motor, a pump, a compressor, or a fan.

19. The machine according to claim 16, wherein the machine is a motor and wherein the electric current sensor is a current clamp or a motor controller that uses a current measurement to regulate a speed and a direction of the motor.

20. The machine according to claim 16, wherein the predetermined second threshold is less than the predetermined first threshold.

* * * * *